(12) United States Patent
Lee

(10) Patent No.: US 7,470,598 B2
(45) Date of Patent: Dec. 30, 2008

(54) SEMICONDUCTOR LAYER STRUCTURE AND METHOD OF MAKING THE SAME

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 214 days.

(21) Appl. No.: 11/092,499

(22) Filed: Mar. 29, 2005

(65) Prior Publication Data

US 2005/0282356 A1 Dec. 22, 2005

Related U.S. Application Data

(63) Continuation-in-part of application No. 10/873,969, filed on Jun. 21, 2004, now Pat. No. 7,052,941.

(51) Int. Cl.
*H01L 21/30* (2006.01)

(52) U.S. Cl. .................. 438/455; 438/138; 438/152; 438/118; 438/458; 438/622; 257/E21.388; 257/E21.703; 257/E27.011; 257/E27.088; 257/E27.122

(58) Field of Classification Search .............. 438/458, 438/455, 118, 622, 138, 152; 257/E27.011, 257/E27.02, E27.088, E27.122, E21.388, 257/E21.703
See application file for complete search history.

(56) References Cited

U.S. PATENT DOCUMENTS

| | | | | |
|---|---|---|---|---|
| 4,704,785 A * | 11/1987 | Curran | | 438/455 |
| 5,093,704 A * | 3/1992 | Saito et al. | | 257/63 |
| 5,308,782 A * | 5/1994 | Mazure et al. | | 438/154 |
| 5,554,870 A * | 9/1996 | Fitch et al. | | 257/334 |
| 6,222,251 B1 * | 4/2001 | Holloway | | 257/607 |
| 6,600,173 B2 * | 7/2003 | Tiwari | | 257/74 |
| 6,995,430 B2 * | 2/2006 | Langdo et al. | | 257/352 |
| 2002/0025604 A1 * | 2/2002 | Tiwari | | 438/118 |
| 2003/0113963 A1 * | 6/2003 | Wurzer | | 438/238 |
| 2004/0080002 A1 * | 4/2004 | Agarwal et al. | | 257/412 |
| 2004/0113207 A1 * | 6/2004 | Hsu et al. | | 257/368 |
| 2004/0262635 A1 * | 12/2004 | Lee | | 257/199 |

* cited by examiner

*Primary Examiner*—Long K Tran
(74) *Attorney, Agent, or Firm*—Schmeiser Olsen & Watts LLP

(57) ABSTRACT

A method of forming a circuit includes providing a first substrate; positioning an interconnect region on a surface of the first substrate; providing a second substrate; positioning a device structure on a surface of the second substrate, the device structure including a stack of at least three doped semiconductor material layers; and bonding the device structure to the interconnect region.

25 Claims, 13 Drawing Sheets

SEMICONDUCTOR LAYER STRUCTURE AND METHOD OF MAKING THE SAME

CROSS REFERENCE TO RELATED APPLICATIONS

This is a continuation-in-part of U.S. patent application Ser. No. 10/873,969, which has issued as U.S. Pat. No. 7,052,941, entitled "THREE-DIMENSIONAL INTEGRATED CIRCUIT STRUCTURE AND METHOD OF MAKING SAME", which was filed 21 Jun. 2004 and is incorporated in its entirety herein by reference.

BACKGROUND OF THE INVENTION

1. Field of the Invention

The present invention relates generally to semiconductors and, more particularly, to forming circuitry using wafer bonding.

2. Description of the Related Art

Advances in semiconductor manufacturing technology have provided computer chips with integrated circuits that include many millions of active and passive electronic devices, along with the interconnects to provide the desired circuit connections. As is well-known, most integrated circuits include laterally oriented active and passive electronic devices that are carried on a single major surface of a substrate. Active devices typically include transistors and passive devices typically include resistors, capacitors, and inductors. However, these laterally oriented devices generally operate slower than desired.

FIG. 1 shows a typical circuit 110 that includes a conventional p-channel MOSFET (Metal Oxide Semiconductor Field Effect Transistor) device 114 and a conventional n-channel MOSFET device 115. Devices 114 and/or 115 can be used in a convention memory circuit which includes known memory devices, such as SRAM (Static Random Access Memory) or DRAM (Dynamic Random Access Memory). Devices 114 and 115 are carried by a p-type doped substrate 111 near its surface 111a. Device 114 is formed in an n-type doped well 116 formed in substrate 111 and includes a $p^+$-type doped source 114a, a $p^+$-type doped drain 114b, a dielectric region 114c, and a control terminal 114d. Dielectric region 114c is positioned on surface 111a and extends between source and drains 114a and 114b. Control terminal 114d is positioned on region 114c. Likewise, device 115 includes an $n^+$-type doped source 115a, a $n^+$-type doped drain 115b, a dielectric region 115c, and a control terminal 115d. Dielectric region 115c is positioned on surface 111a and extends between source and drains 115a and 115b. Control terminal 115d is positioned on region 115c.

Devices 114 and 115 are typically called lateral or planar devices because their source and drains are positioned along a direction z oriented parallel to surface 111a. In operation, a p-type channel 114e and an n-type channel 115e are provided between source and drains 114a,114b and 115a,115b, respectively, in response to control signals provided to corresponding control terminals 114d and 115d. Hence, the current flow through channels 114e and 115e is substantially parallel to surface 111a.

There are several problems with lateral devices, such as devices 114 and 115. One problem is that they operate slower than typically desired. FIG. 2 shows the doping concentration verses direction z shown in FIG. 1 for MOSFET 115. The p-type doping concentration in n-type channel 115e is constant between source 115a and drain 115b. Hence, the electric field between source 115a and drain 115b is practically zero without a signal being applied to drain 115b. As a result, the mobility of electrons through n-type channel 115e is less than it would be if there was a non-constant doping concentration in this region. As a consequence, MOSFET 115 operates slower because the doping concentration in n-type channel 115e is constant. The same is true for minority carries (i.e. holes) flowing through p-type channel 114e of MOSFET 114, however its doping concentration is not shown for simplicity.

Accordingly, it is highly desirable to provide new structures and methods for fabricating computer chips which operate faster.

BRIEF SUMMARY OF THE INVENTION

The present invention provides a method of forming a circuit which includes providing a first substrate; positioning an interconnect region on a surface of the first substrate; providing a second substrate; positioning a device structure on a surface of the second substrate, the device structure including a stack of at least three doped semiconductor material layers; and bonding the device structure to the interconnect region.

The present invention also provides a method of forming a circuit which includes providing a first substrate which carries electronic circuitry; positioning an interconnect region on a surface of the first substrate, the interconnect region having conductive interconnects and vias extending therethrough; providing a second substrate which carries a device structure, the device structure including a stack of doped semiconductor material layers; coupling the device structure to the interconnect region; removing at least a portion of the second substrate from the device structure; and processing the device structure to form at least one electronic device therewith, the electronic device(s) being electrically coupled to the electronic circuitry through the interconnect region.

The present invention further provides a method of forming a circuit which includes providing a first substrate which carries electronic circuitry; positioning an interconnect region on a surface of the first substrate, the interconnect region having conductive interconnects and vias extending therethrough; providing a second substrate; positioning a device structure on a surface of the second substrate, the device structure including a plurality of stacked semiconductor material layers; coupling the device structure to the interconnect region; removing at least a portion of the second substrate from the device structure; and processing the device structure to form at least one memory device therewith, the memory device(s) being electrically coupled to the electronic circuitry through the interconnect region.

These and other features, aspects, and advantages of the present invention will become better understood with reference to the following drawings, description, and claims.

DETAILED DESCRIPTION OF THE INVENTION

Figure 3:
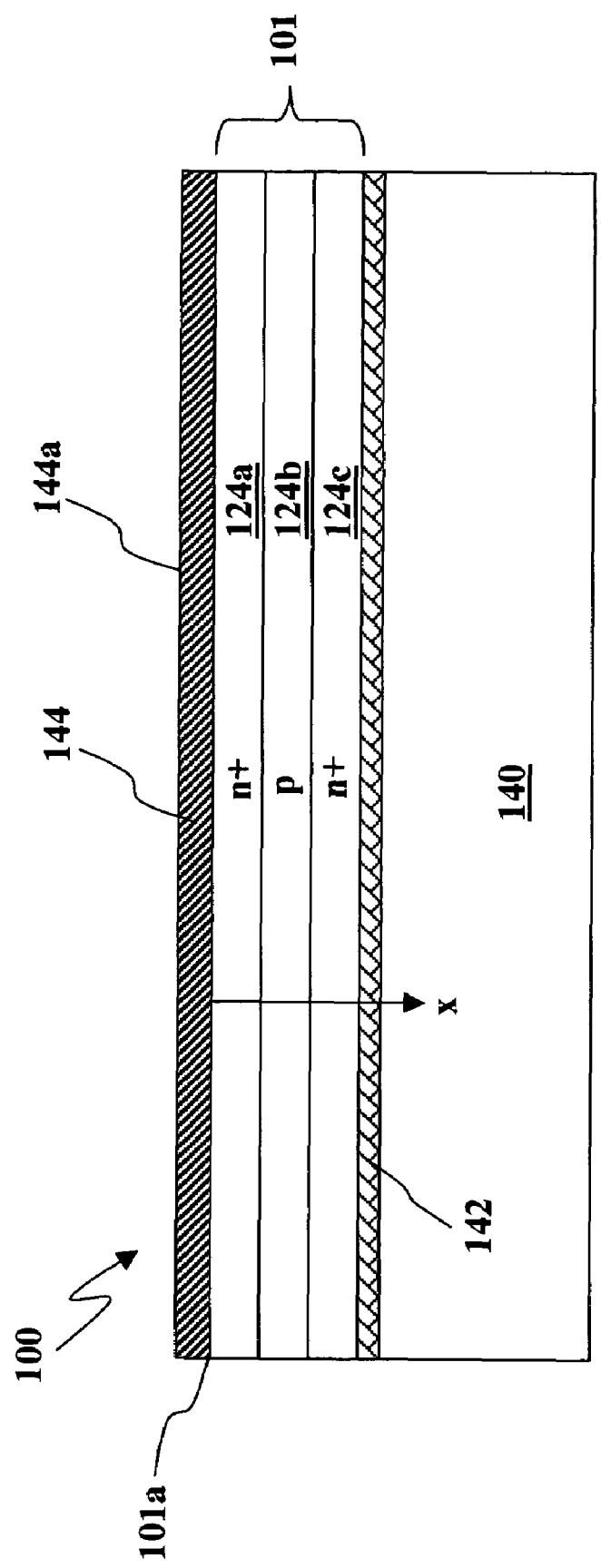
FIGS. 3-5 are simplified sectional views of steps in fabricating a circuit using the semiconductor circuit in FIG. 1.
Figure 4:
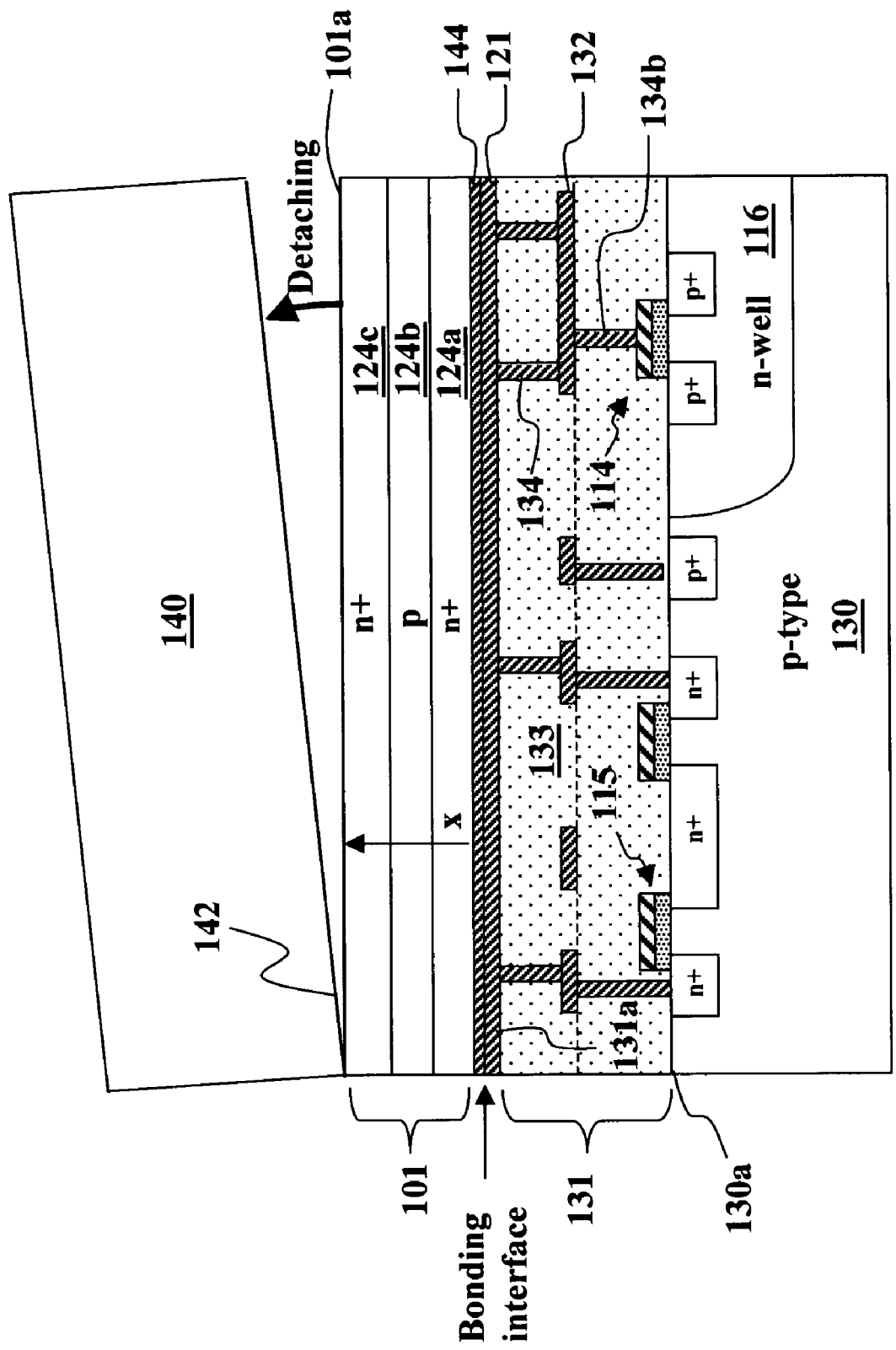
Figure 5:
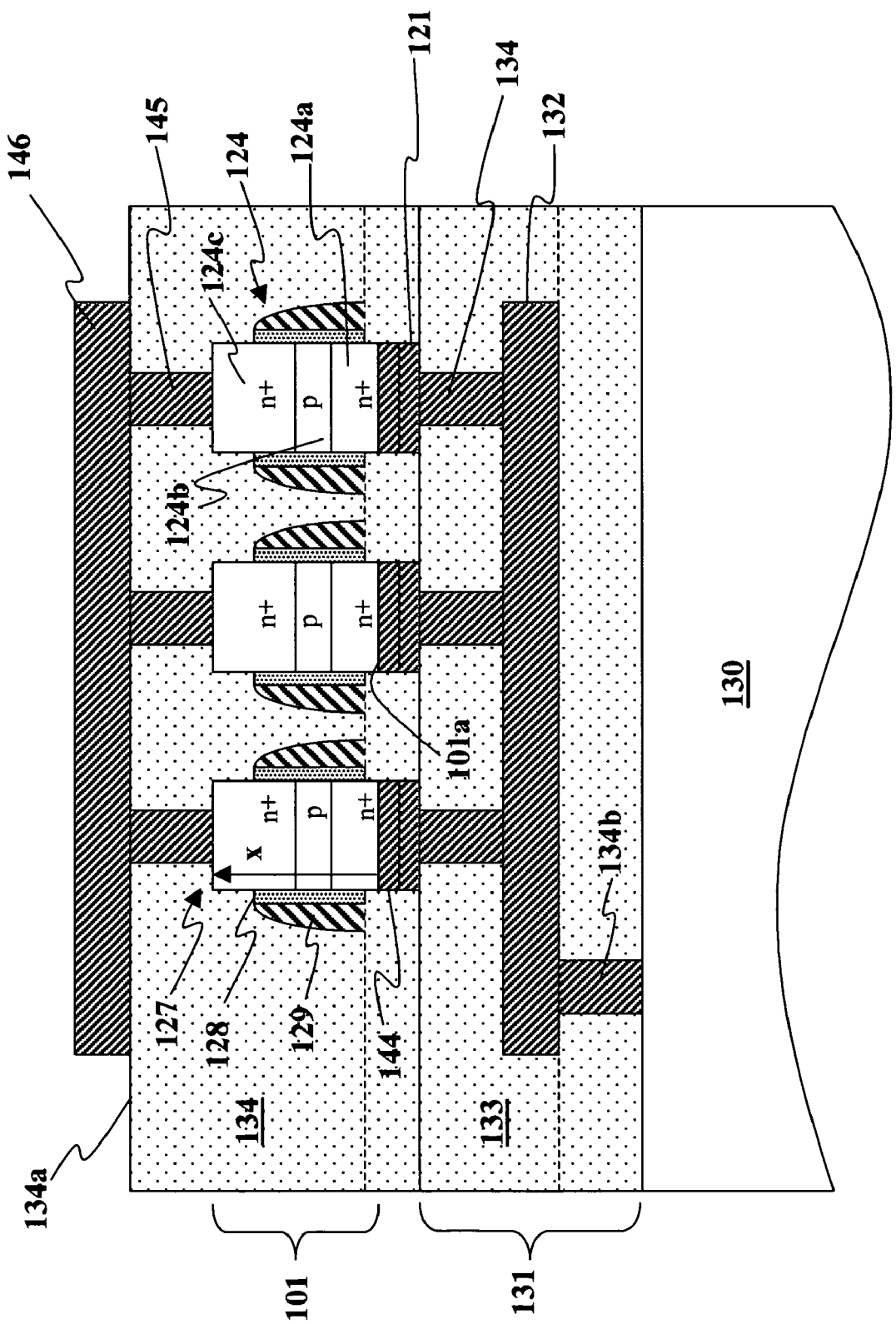

FIGS. 3-5 are simplified sectional views of steps in fabricating a circuit 100 using wafer bonding in accordance with the present invention. It should be noted that in the following figures, like reference characters indicate corresponding elements throughout the several views. FIG. 3 shows partially fabricated circuit 100 which includes a donor substrate 140 that has portions doped n-type or p-type, although it can have undoped portions. Substrate 140 can be doped by diffusion, implantation, and/or during deposition. Substrate 140 is silicon in this example and the examples discussed herein, although substrate 140 can include other materials, such as gallium arsenide or indium phosphide.

Substrate 140 includes a detach region 142 which is a portion of substrate 140 positioned near its surface 140a. Region 142 can be formed in many different ways so that its mechanical strength is less than that of substrate 140. For example, region 142 can be formed by ion implantation to cause damage below surface 140a (FIGS. 10-13). The ions implanted can include hydrogen or oxygen, among others. In other examples, region 142 can also include one or more porous semiconductor material layers, a lattice mismatched layer, an etch stop layer, or combinations thereof. In some examples, the porous semiconductor material includes the same material as substrate 140, only the material is deposited by electroplating. The lattice mismatched layer can be formed by growing region 142 with the same material as substrate 140, but including impurities to change its lattice constant. In other examples, the lattice mismatched layer can be formed by including materials, such as silicon and/or germanium, in region 142. The etch stop layer can include a dielectric layer or an alloy of the material included in substrate 140.

A device structure 101 is positioned on surface 140a of substrate 140. Device structure 101 can include many different layer structures, but here it includes an n$^+$-type doped region 124c with a p-type doped region 124b positioned thereon. An n$^+$-type doped region 124a is positioned on region 124b so that structure 101 forms an n$^+$pn$^+$ layer stack. It should be noted that structure 101 can have a p$^+$np$^+$ layer stack and it can have a different number of layers other than three. Device structure 101 typically has a thickness of about 0.01 microns (μm) to 5 μm, depending on the aspect ratio of the devices formed therewith. The aspect ratio is the ratio of the height and width of the device. As the aspect ratio increases, the height of the device increases and its width decreases.

Also, regions 124a-124c preferably include single crystalline material which can have localized crystalline defects, but is generally of better material quality than amorphous or polycrystalline material. The preferred material is silicon, but regions 124a-124c can include other materials, such as gallium arsenide or indium phosphide, among others, which can be deposited on surface 140a. Regions 124a-124c can be formed in many different ways. In accordance with the invention and as discussed in more detail in conjunction with FIGS. 6-13, regions 124a-124c can be doped by ion implantation, diffusion, plasma doping, during deposition, or combinations thereof. Further, regions 124a-124c can be a part of substrate 140, as in this example, or they can be regions subsequently grown thereon surface 140a.

After regions 124a-124c are formed and doped, a conductive region 144 is positioned on a surface 101a of structure 101. Conductive region 144 can include one or more material layers stacked on top of each other, but is shown as one layer here for simplicity. The material layers in region 144 can include conductive and/or dielectric material layers. It should be noted that region 144 is optional, but is shown here for illustrative purposes.

Figure 1:
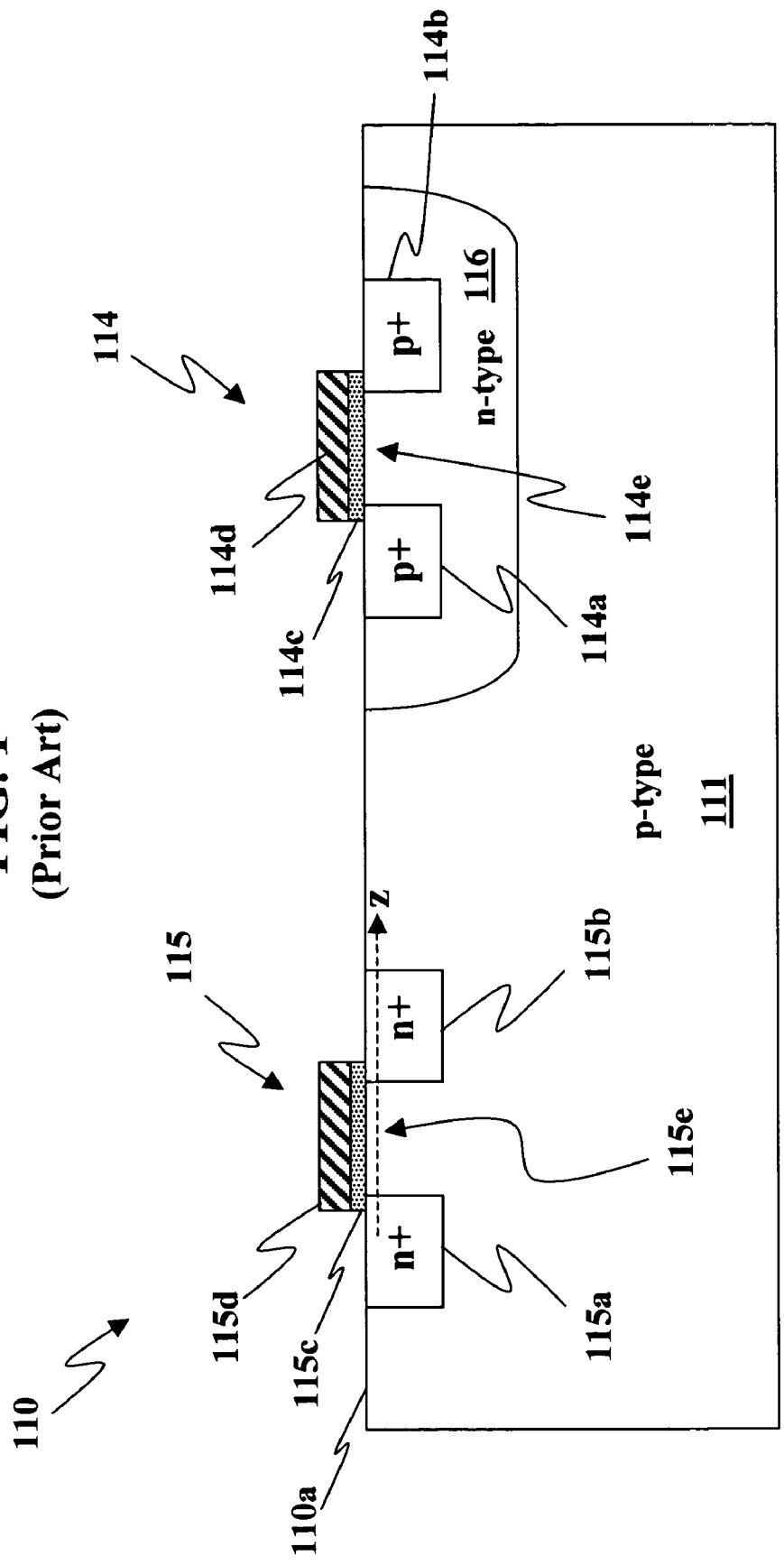
FIG. 1 shows a prior art semiconductor circuit that includes planar electronic devices.
Figure 2:
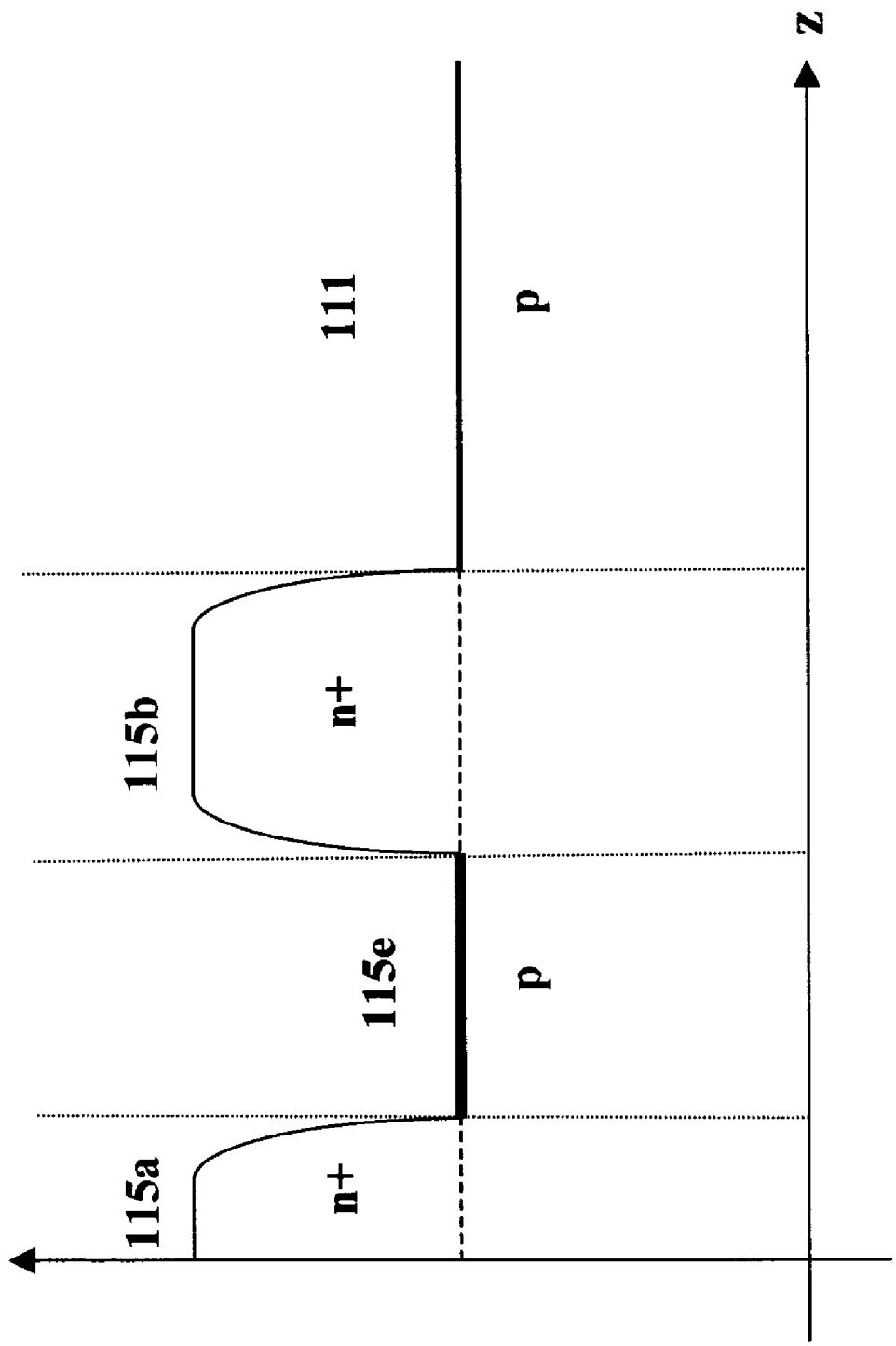
FIG. 2 shows the doping concentration verses direction z shown in FIG. 1 through one of the planar semiconductor devices.

In FIG. 4, an acceptor substrate 130 is provided which can be similar to substrate 111 shown in FIG. 1. Here, portions of substrate 130 are doped p-type and other portions are doped n-type, although some portions can be undoped. Substrate 130 carries electronic circuitry, such as MOSFET 114 and 115, shown in FIG. 1. An interconnect region 131 is positioned on a surface 130a of substrate 130. Interconnect region 131 includes interconnect lines 132 and vias 134 which extend through a dielectric material region 133. Interconnect lines 132 extend substantially parallel to surface 130a and vias 134 extend substantially perpendicular to it. The interconnect lines and vias included in region 131 are coupled to devices 114 and 115 so that signals can flow between them and a conductive contact 121 positioned on a surface 131a of region 131. More information regarding acceptor substrate 130 and donor substrate 140 can be found in a co-pending U.S. patent application Ser. No. 11/092,501, entitled "SEMICONDUCTOR BONDING AND LAYER TRANSFER METHOD", which was filed on Mar. 29, 2005 by the same inventor and is incorporated in its entirety herein by reference.

In accordance with the invention, conductive region 144 is bonded to region 121. The bonding can be done in many different ways as discussed in the above cited reference. For example, regions 121 and 144 can be heated so that material included in them intermixes and couples them together. Regions 121 and/or 144 can even be reflowed as discussed in a co-pending U.S. patent application Ser. No. 11/092,498 entitled "WAFER BONDING METHOD", which was filed on Mar. 29, 2005 by the same inventor and is incorporated in its entirety herein by reference. After regions 121 and 144 are bonded together, donor substrate 140 is removed from structure 101. This can be done by mechanical force, chemical force, or chemical mechanical polishing. More information on how substrate 140 can be removed from structure 101 can be found in the co-pending U.S. patent application Ser. No. 11/092,501, which is cited above.

As shown in FIG. 5, after substrate 140 is removed, device structure 101 is etched to form devices 124. Devices 124 each include regions 124a, 124b, and 124c and form a stack 127. A dielectric region 128 is positioned around an outer periphery of each stack 127 and a control terminal 129 is positioned around an outer periphery of dielectric region 128 so that each stack 127 along with its corresponding region 128 and terminal 129 operates as an n-channel MOSFET. Devices 124 are surrounded by a dielectric region 134 which is positioned on dielectric region 133. Bit line vias 145 extend from each region 124c through region 134 and to a surface 134a of region 134. A bit line 146 is positioned on surface 134a so that it is in contact with bit line vias 145.

Devices 124 can operate as DRAM (Dynamic Random Access Memory), SRAM (Static Random Access Memory), nonvolatile memories, or image sensors. Stack 127 can include a number of material layers so that device 124 operates as a bipolar transistor, MOSFET, diode, thyristor, or capacitor. More information regarding electronic devices can be found in co-pending U.S. patent application Ser. Nos. 11/092,500 and 11/092,521, entitled "SEMICONDUCTOR MEMORY DEVICE" and "ELECTRONIC CIRCUIT WITH EMBEDDED MEMORY", respectively, which were both filed on Mar. 29, 2005 by the same inventor and are incorporated in their entirety herein by reference.

Figure 6:
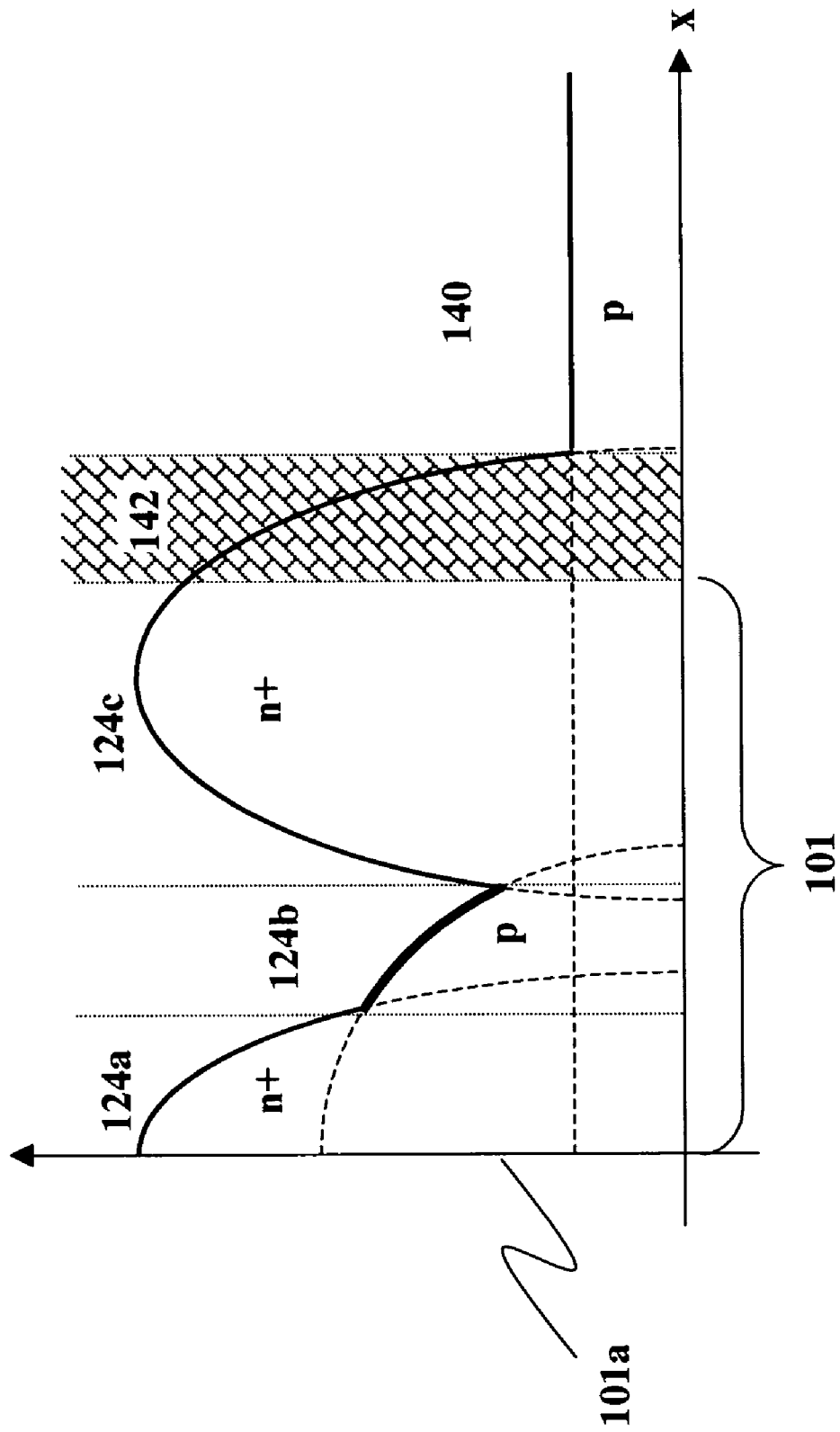
FIG. 6 shows a simplified diagram of the doping concentration ($cm^{-3}$) in the direction of an x direction shown in FIGS. 3-5.

FIG. 6 shows a simplified diagram of the doping concentration ($cm^{-3}$) in the direction of an x-axis shown in FIG. 5. The x-axis extends between region 144 and bit line via 145. In this example, substrate 140 is lightly doped p-type during its fabrication with a doping concentration less than that of region 124b. Regions 124a, 124b, and 124c are formed by ion implantation and the energy and the dose of the various implants are chosen so that region 124a is next to region 144 and region 124c is next to bit line via 145. The energy and dose of the implant for region 124b is chosen so that region 124b is between regions 124a and 124c. As shown in FIG. 6, a portion of the implant can extend into region 142 of substrate 140 before substrate 140 is removed as shown in FIG. 4. Appropriate p-type and n-type impurities in silicon include boron and phosphorus, respectively.

As is well known in the art, the energy, dose, and/or angle of implanted ions can be adjusted to adjust the doping profile. The implantation of a dose of ions at a particular energy and angle provides a concentration profile that is similar to a Gaussian shape. The energy and dose of the p-type implant in region 124b is chosen so that its doping concentration in region 124b is not constant. Here, its concentration near region 124a is higher than its doping concentration near region 124c so that it is sloped. Semiconductors with sloped doping concentrations are often referred to as being graded or as having graded doping concentrations.

It is preferable to perform the high energy implantation first when forming regions 124a-124c and the low energy implantation last. Hence, in some embodiments, the implantation for detaching region 142 is done first and then the implantations for regions 124c, 124b, and 124a are to be done sequentially in that order. In some examples, the implanted dopants for regions 124a-124c can be activated at high temperature after detach region 142 has been formed.

In accordance with the invention, regions 124a-124c are doped with doping profiles which provide an improved device performance. One reason the performance is improved is because bit line via 145 is coupled to region 124c which has a lower doping concentration and region 144 is coupled to region 124a which has a higher doping concentration so that the doping concentration 124b is graded. Hence, if contact 144 operates as a current return and bit line via 145 operates as a bias potential, then charges can be flowed to and from device 124 in a shorter amount of time because the graded doping concentration provides an electric field which increases the mobility of the charge carriers.

The time is further reduced because device 124 can be operated with a larger drive current. One reason the drive current is increased is because control terminal 129 and dielectric region 128 surround stack 127 so more current can be used to drive the memory device. A larger current means that charges can be flowed to and from device 124 in a shorter amount of time so that it can switch between its on and off states quicker.

The time is reduced even more because device 124 has a reduced series resistance and parasitic capacitance. The series resistance is reduced because regions 124a and 124c are adjacent to conductive region 144 and bit line via 145, respectively, instead of a highly doped semiconductor region. Conductive region 144 and bit line via 145 both have lower low resistivities than a highly doped semiconductor region and, consequently, the resistance between regions 124a and 124c and region 144 and bit line via 145, respectively, is reduced. The parasitic capacitance is reduced because it depends on the material properties of a bulk region coupled to memory device 124. However, as shown in FIG. 4, the bulk region (i.e. substrate 140) is removed so the parasitic capacitance is reduced.

Figure 7:
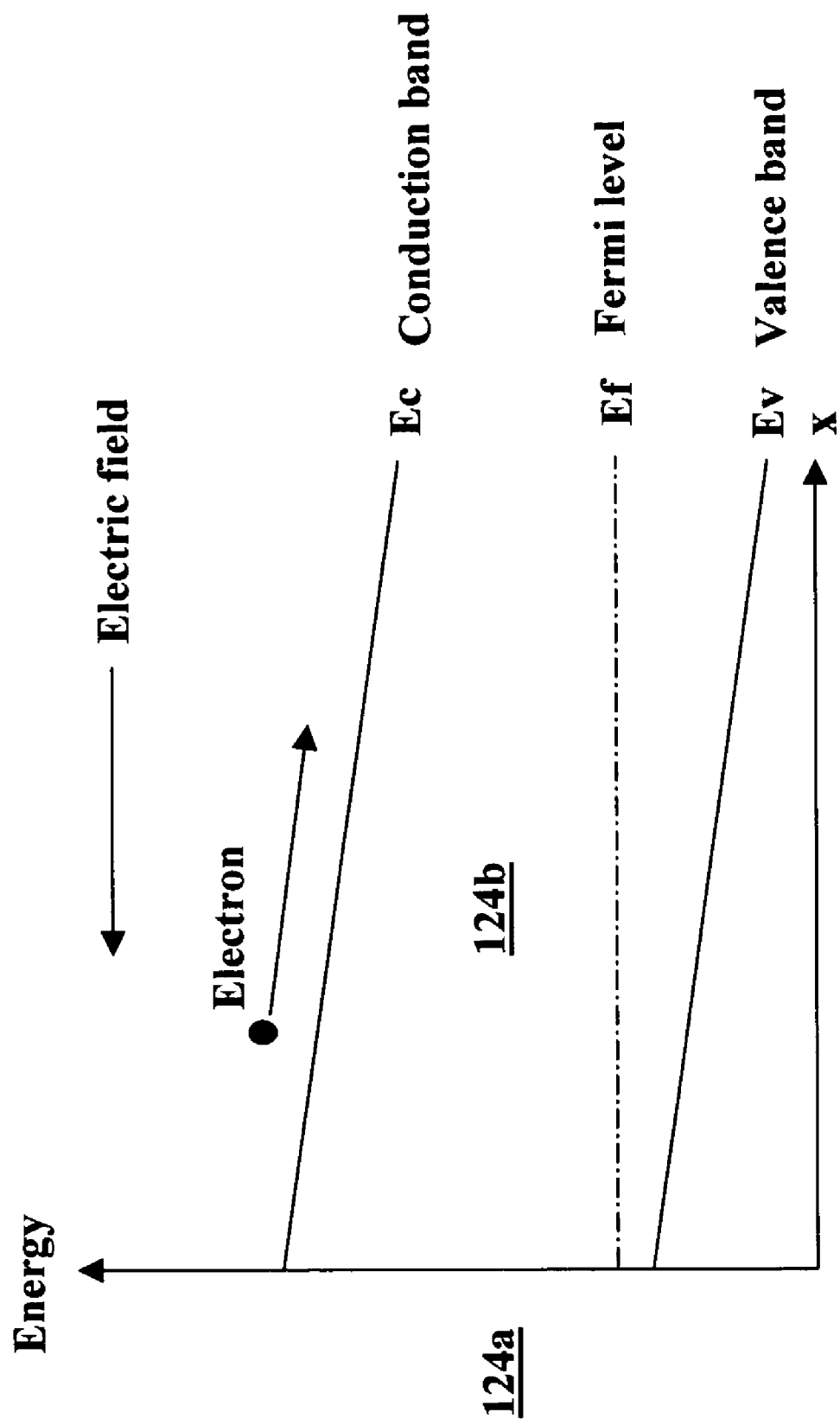
FIG. 7 shows a simplified band diagram of the device structure of FIG. 5 in the x direction.

FIG. 7 shows a simplified band diagram of structure 101. Because region 124b has a graded p-type doping concentration as shown in FIG. 6, the electric field near region 124a is greater than the electric field near region 124c. Because of this, minority carriers (i.e. electrons) within the channel formed in region 124b will have a higher mobility and flow faster towards region 124c. For high speed memory applications, it is more advantageous to use region 124a as a source and region 124c as a drain then vice versa. This is because graded p-type doping region 124b operates as a channel which enhances the flow of electrons therethrough in response to a signal applied to region 124b through control terminal 129 (See FIG. 5). As a result, this increases the mobility of minority carriers flowing therethrough and suppresses short-channel effects.

Figure 8:
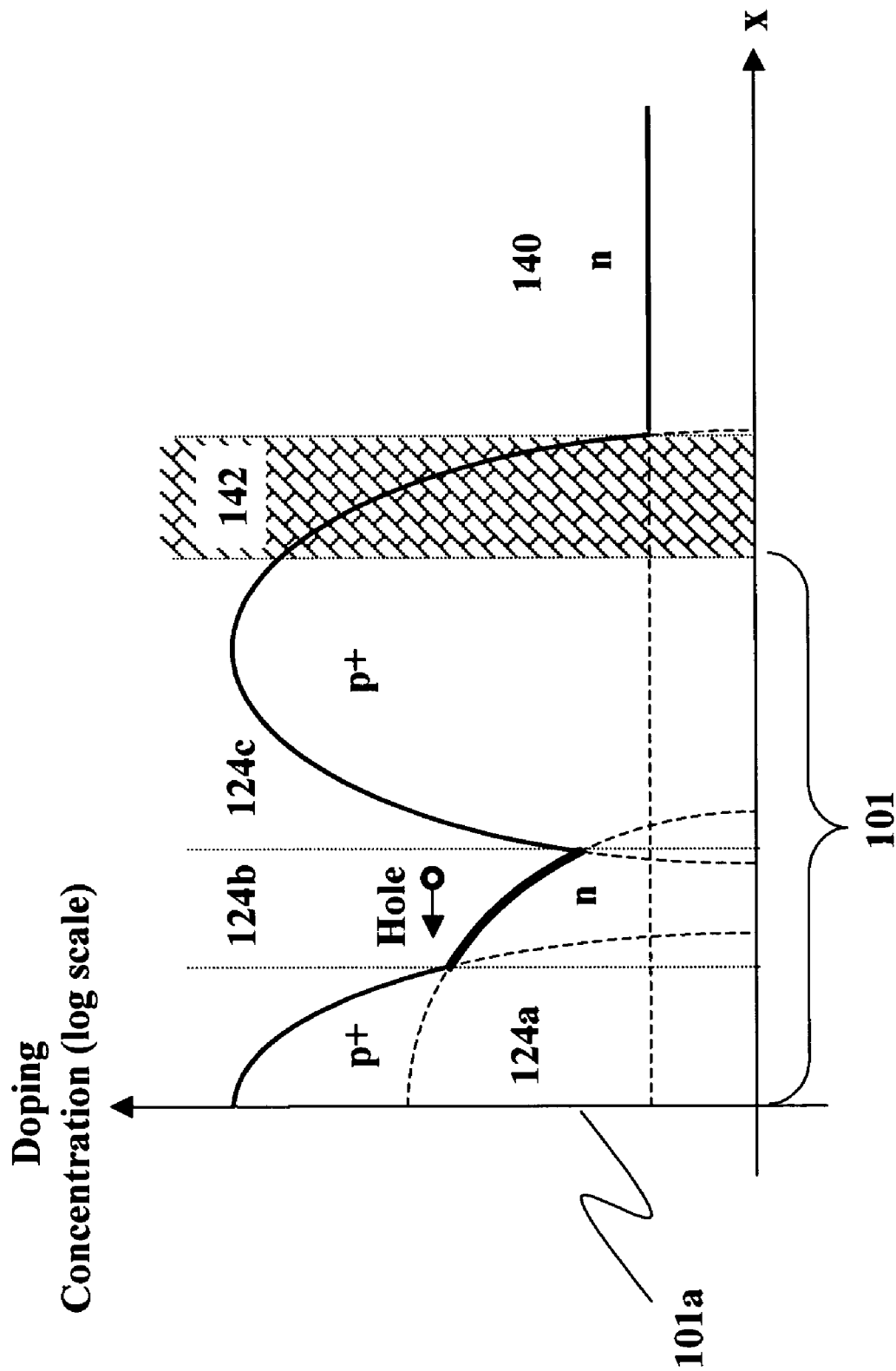
FIGS. 8-13 show simplified diagrams of the doping concentration (cm$^{-3}$) in the direction of the x-axis shown in FIG. 3-5 for various doping profiles of the device structure.

FIG. 8 shows a simplified diagram of the doping concentration ($cm^{-3}$) in the direction of the x-axis shown in FIG. 5 when device 124 includes a $p^+np^+$ layer stack instead of an $n^+pn^+$ layer stack as shown in FIG. 5. Here, substrate 140 is doped n-type instead of p-type as in FIG. 6. With this doping profile, device 124 operates as a p-channel MOSFET instead of an n-channel MOSFET as above. In this example, the carrier concentration in region 124b is sloped so that the minority hole carriers flow faster therethrough.

Figure 9:
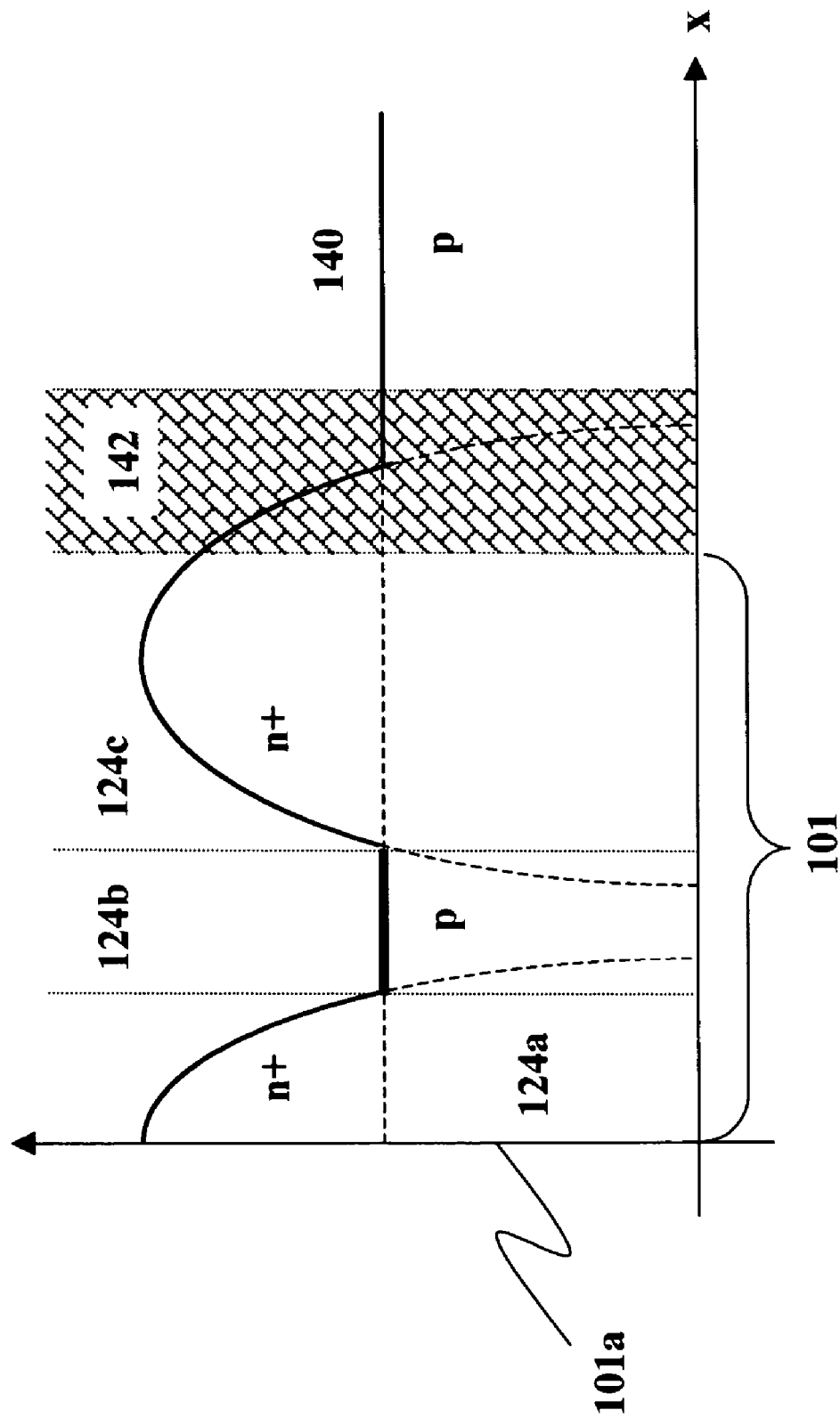

FIG. 9 shows a simplified diagram of the doping concentration ($cm^{-3}$) in the direction of the x-axis shown in FIG. 5 when device 124 includes an $n^+pn^+$ layer stack. Here, the doping concentration for regions 124a and 124c is formed with ion implantation, as discussed above, and the doping concentration for region 124b is provided during growth so that it is substantially flat in the x-direction. Since the doping concentration in region 124b is substantially flat, regions 124a and 124c can operate as the source and drain interchangeably which increases the circuit design flexibility.

Figure 10:
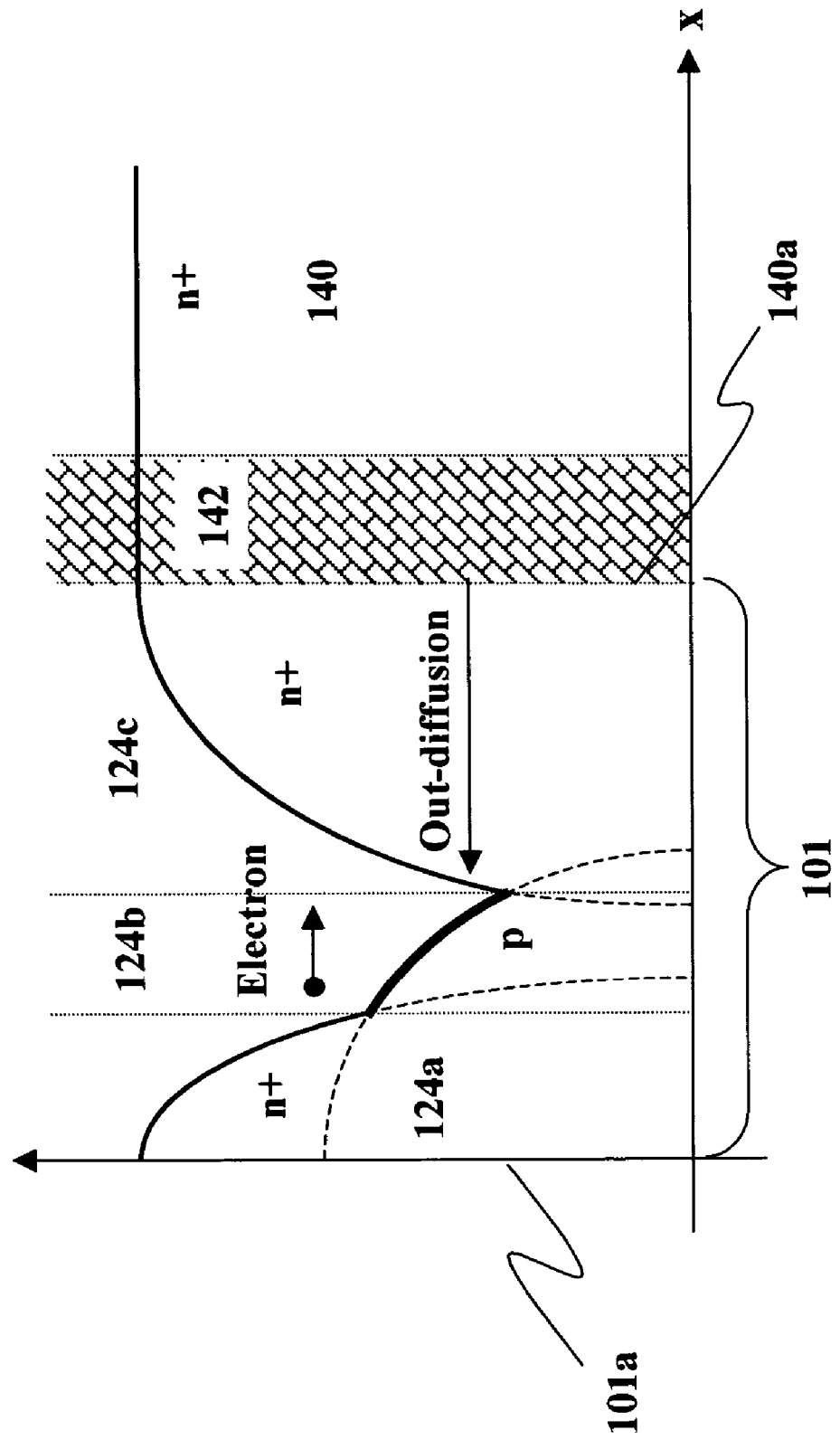
Figure 11:
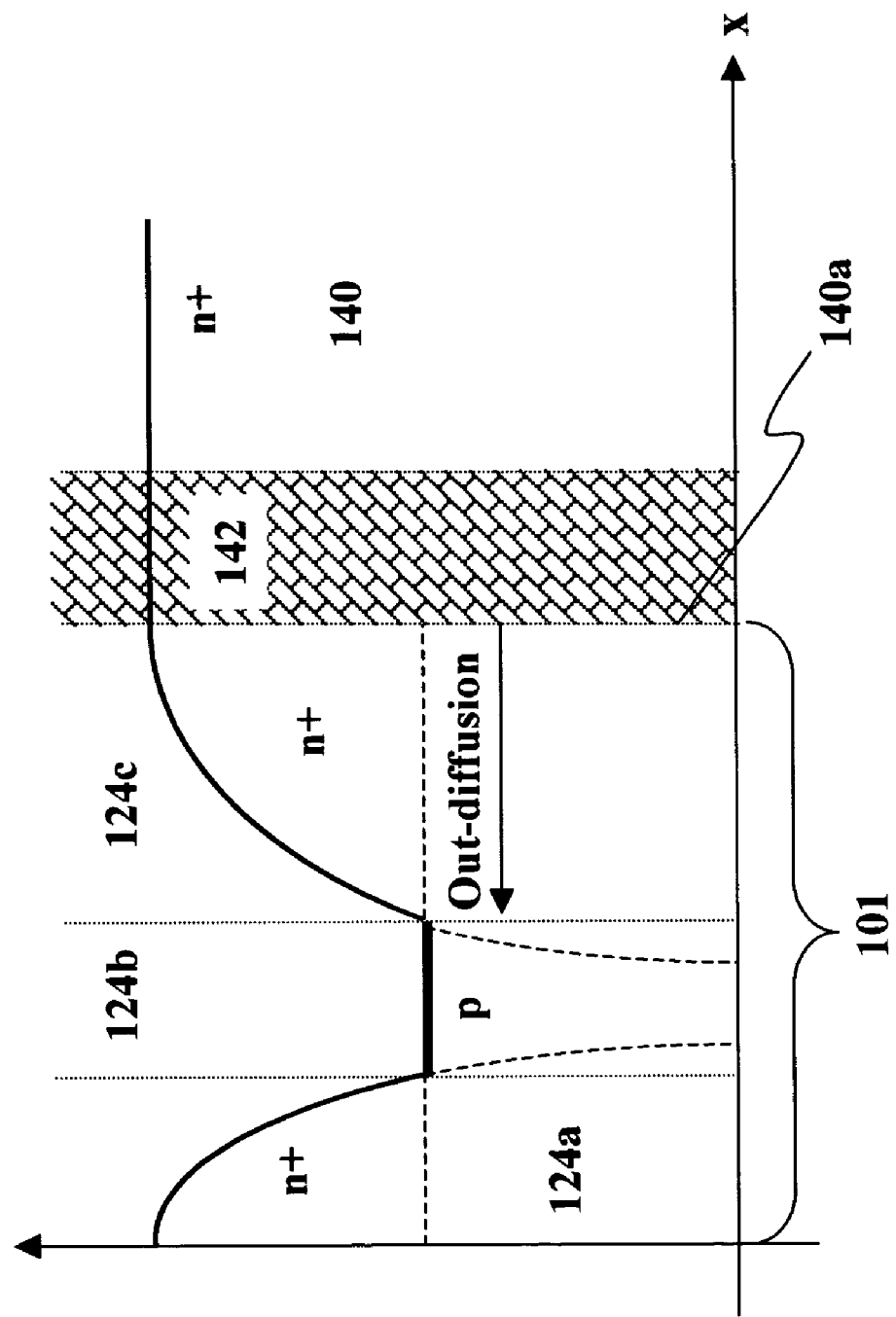

FIGS. 10 and 11 show simplified diagrams of the doping concentration ($cm^{-3}$) in the direction of the x-axis shown in FIG. 5 when device 124 includes an $n^+ pn^+$ layer stack. In FIG. 10, region 124b is doped p-type with a graded doping profile and in FIG. 11 region 124b is doped p-type with a substantially constant doping profile. In both FIGS. 10 and 11, substrate 140 is heavily doped n-type so that carriers included therein out-diffuse from it, through region 124c, and into region 124b. The out-diffusion occurs during the formation of structure 101 at an elevated temperature. In this way, graded region 124b is formed by ion implantation in FIG. 10 and region 124b in FIG. 11 is provided with a substantially constant doping concentration because it is doped during growth.

Figure 12:
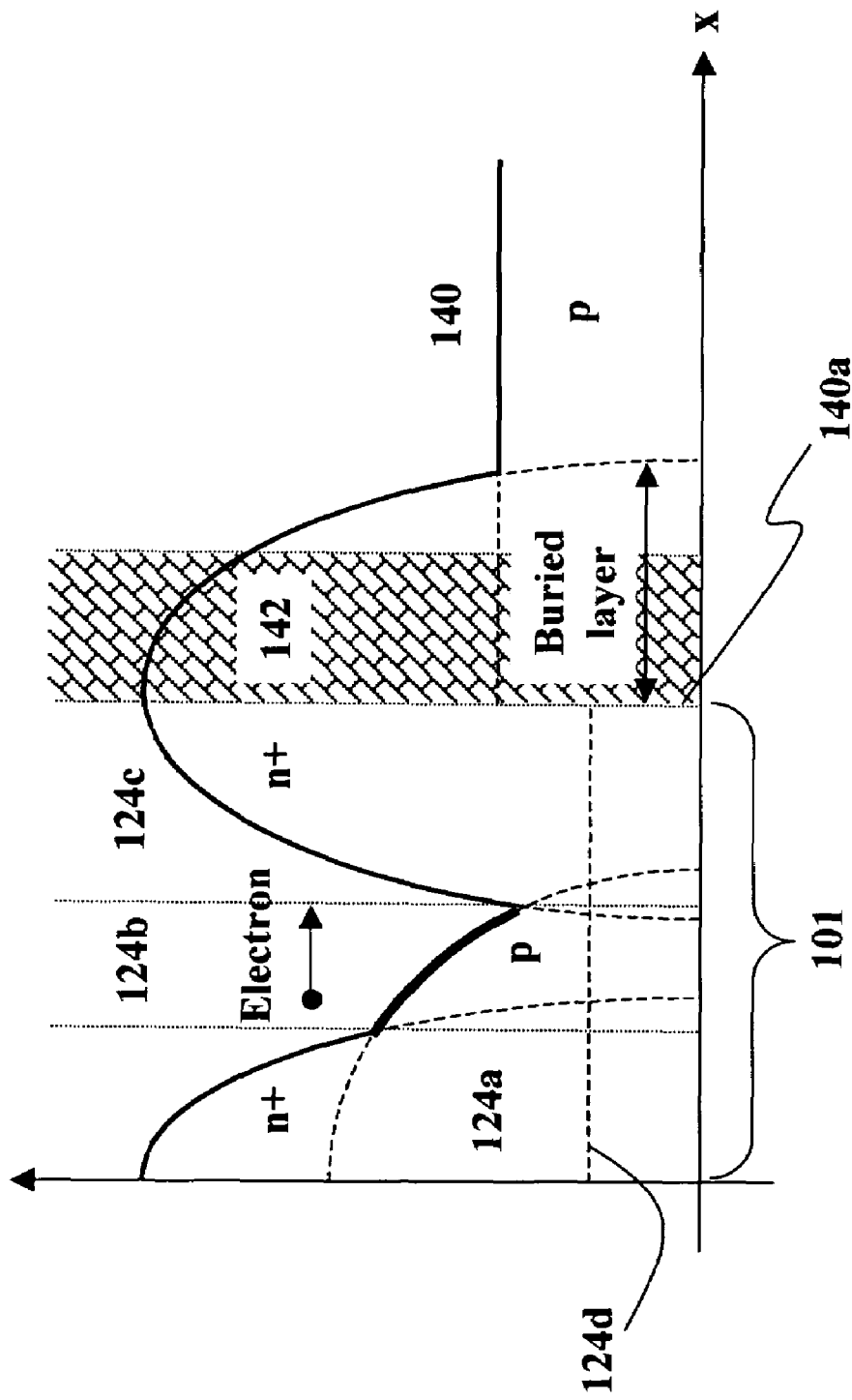
Figure 13:
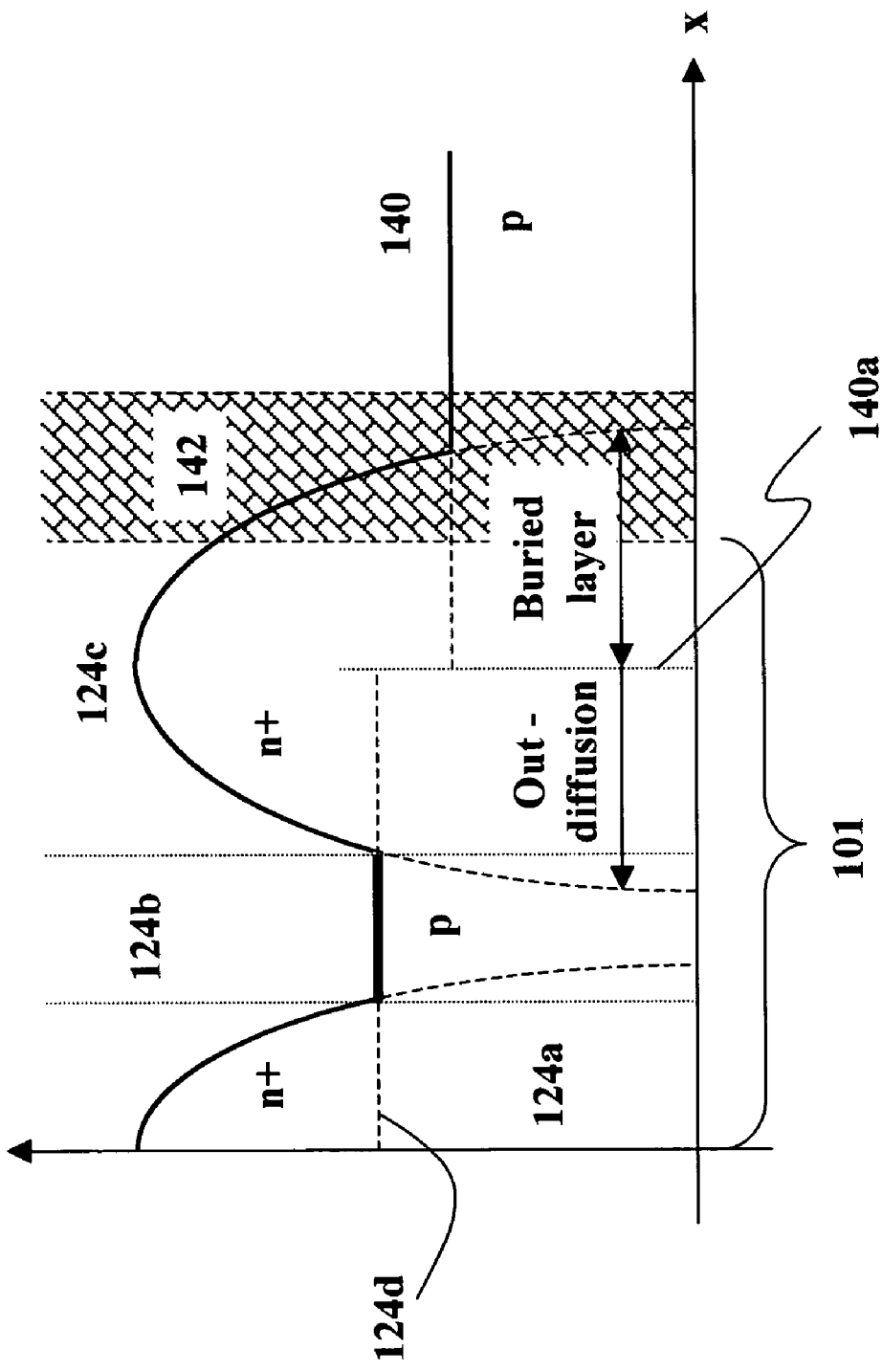

FIGS. 12 and 13 show simplified diagrams of the doping concentration ($cm^{-3}$) in the direction of the x-axis shown in FIG. 5 when device 124 includes an $n^+pn^+$ layer stack. Region 124b can be doped with a graded doping profile as in FIG. 12 or with a substantially constant doping profile as in FIG. 13. Here, as in FIGS. 10 and 11, the dopants in substrate 140 out-diffuse during the growth of region 124c. However, unlike the heavily doped substrates in FIGS. 10-11, the buried heavily doped layer in FIGS. 12-13 is localized in a desired area only. Another advantage is that the doping concentration of the buried layer can be easily modified to a desired doping concentration without the need for changing substrates. For example, certain regions can have a buried layer and could be used for flash memory and another region can be used for DRAM (Dynamic Random Access Memory) devices without a buried layer.

The present invention provides semiconductor wafer structures and method of making the same. The semiconductor wafers are to be used for layer transfer in SOI technology. The acronym "SOI" generally refers to Silicon-on-Insulator. As will be appreciated by those skilled in this field, SOI layers can be formed in a variety of ways. Unless otherwise noted, "SOI layer" is used herein to refer to a relatively thin, single crystalline portion of a semiconductor wafer that can be cleaved and bonded to another previously fabricated wafer, or similar type of substrate, such that a three dimensional stack is formed from the SOI layer and the previously fabricated wafer or similar type of substrate. In this context, the SOI layer may be thought of as an attachment layer, or stackable add-on device structure, that itself contains at least devices and/or interconnections, and which is suitable for bonding to a semiconductor substrate already containing devices and/or interconnections. As a stackable add-on layer, the single-crystal layer may have been doped so as to have one or more doped regions vertically adjacent each other. For purposes of this disclosure, doped regions may include intrinsic regions as well as p-type and n-type regions. Individual semiconductor structures may be formed by etching through portions of the doped stack to electrically isolate those structures. The spaces between such individual structures may be filled dielectric material so as to re-form a layer without gaps or voids therein, and thereby provide for mechanical stability, and support for additional stacked layers.

The present invention is described above with reference to preferred embodiments. However, those skilled in the art will recognize that changes and modifications may be made in the described embodiments without departing from the nature and scope of the present invention. Various further changes and modifications will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

1. A method of forming a circuit comprising:
   providing a first substrate which carries electronic circuitry;
   positioning an interconnect region on a surface of the first substrate;
   providing a second substrate which carries a detach region and a device structure, the device structure including a stack of single crystalline semiconductor material layers, at least a portion of the device structure being doped;
   bonding the device structure to the interconnect region;
   removing at least a portion of the second substrate from the device structure by etching; and
   processing the device structure to form at least one electronic device therewith;
   wherein at least one layer in the stack is intrinsically doped;
   wherein the stack includes a first layer of a first conductivity type positioned between second and third layers of opposite conductivity types, the doping concentration of the first layer near the second layer being different from the doping concentration of the first layer near the third layer.

2. A method of forming a circuit comprising:
   providing a first substrate which carries electronic circuitry;
   forming an interconnect region on a surface of the first substrate;
   providing a second substrate which carries a detach region and a device structure, the device structure including a stack of doped semiconductor material layers, at least a portion of the device structure including single crystalline material;
   wherein the stack of doped semiconductor material layers includes a layer with a graded doping concentration;
   wherein a portion of the device structure is doped by the out-diffusion of impurity dopants from at least one of the second substrate and detach region;
   coupling the device structure to the interconnect region;
   removing at least a portion of the second substrate from the device structure by cleaving through the detach region; and
   processing the device structure to form at least one electronic device therewith, the electronic device(s) being electrically coupled to the electronic circuitry through the interconnect region.

3. A method of forming a circuit comprising:
   providing a first substrate which carries electronic circuitry;
   forming an interconnect region on a surface of the first substrate;
   providing a second substrate which carries a device structure, the device structure including a stack of doped semiconductor material layers, at least a portion of the device structure including single crystalline material;
   wherein the stack of doped semiconductor material layers includes a layer with a graded doping concentration;
   wherein a portion of the device structure is doped by the out-diffusion of impurity dopants from the detach region;
   coupling the device structure to the interconnect region;
   removing at least a portion of the second substrate from the device structure by cleaving through the detach region; and
   processing the device structure to form at least one electronic device therewith, the electronic device(s) being electrically coupled to the electronic circuitry through the interconnect region.

4. A method of forming a circuit comprising:
   providing a first substrate which carries electronic circuitry;
   forming an interconnect region on a surface of the first substrate;
   providing a second substrate which carries a detach region and a device structure, the device structure including a stack of doped semiconductor material layers, at least a portion of the device structure including single crystalline material;
   wherein the stack of doped semiconductor material layers includes a first layer with a graded doping concentration;
   wherein a portion of the device structure is doped by the out-diffusion of impurity dopants from the second substrate and/or detach region;
   coupling the device structure to the interconnect region;
   removing at least a portion of the second substrate from the device structure by cleaving through the detach region; and
   processing the device structure to form at least one electronic device therewith, the electronic device(s) being electrically coupled to the electronic circuitry through the interconnect region.

5. The method of claim 4 wherein the stack includes at least one p-n junction.

6. The method of claim 4 wherein the stack includes alternately doped semiconductor layers.

7. The method of claim 4 wherein the detach region includes at least one of a dielectric material region, a hydrogen doped region, and a porous region.

8. The method of claim 4 wherein the detach region is formed after forming the device structure.

9. The method of claim 4 wherein the stack of semiconductor layers is formed by ion implantation.

10. The method of claim 4 wherein the doping concentration of at least one layer in the stack of semiconductor material layers is chosen to enhance the flow of minority carriers therethrough.

11. The method of claim 4 wherein at least one of the electronic device(s) is a vertically oriented semiconductor device.

12. The method of claim 4 wherein the stack of semiconductor material layers extends away from the interconnect region.

13. The method of claim 4 wherein the step of processing the device structure includes forming a dielectric region which extends around the stack of semiconductor material layers.

14. A method of forming a circuit comprising:
providing a first substrate which carries electronic circuitry;
forming an interconnect region which is connected to the electronic circuitry;
providing a second substrate which carries a device structure, the device structure including a stack of doped semiconductor material layers, at least a portion of the device structure including single crystalline material;
coupling the device structure to the interconnect region; and
processing the device structure to form a vertically oriented semiconductor device therewith, the vertically oriented semiconductor device being formed after the device structure is coupled to the interconnect region.

15. The method of claim 14 wherein the step of forming the vertically oriented semiconductor device includes etching the device structure to form a mesa structure.

16. The method of claim 15 wherein the step of forming the vertically oriented semiconductor device includes forming a dielectric material region around the mesa structure.

17. The method of claim 16 wherein the step of forming the vertically oriented semiconductor device includes forming a control terminal around the dielectric material region.

18. The method of claim 14 wherein the device structure and interconnect region are coupled together through a conductive region.

19. The method of claim 18 wherein the step of forming the vertically oriented semiconductor device includes etching the device structure to form a mesa structure, the mesa structure being carried by the conductive region.

20. The method of claim 14 wherein the device structure and interconnect region are coupled together through a conductive region.

21. The method of claim 20 wherein the mesa structure is carried by the conductive region.

22. A method of forming a circuit comprising:
providing a first substrate which carries electronic circuitry;
forming an interconnect region;
providing a second substrate which carries a device structure, the device structure including a stack of doped semiconductor material layers, at least a portion of the device structure including single crystalline material;
coupling the device structure to the interconnect region; and
processing the device structure to form a vertically oriented semiconductor device therewith;
wherein the vertically oriented semiconductor device is formed after the device structure is coupled to the interconnect region;
wherein the step of forming the vertically oriented semiconductor device includes etching the device structure to form a mesa structure.

23. The method of claim 22 wherein the stack of doped semiconductor material layers includes a layer with a graded doping concentration.

24. The method of claim 22 wherein a portion of the device structure is doped by the out-diffusion of impurity dopants.

25. The method of claim 22 wherein the step of forming the vertically oriented semiconductor device includes forming a dielectric material region around the mesa structure, and forming a control terminal around the dielectric material region.

* * * * *